(12) United States Patent
Valette et al.

(10) Patent No.: US 7,485,362 B2
(45) Date of Patent: Feb. 3, 2009

(54) NANOPOROUS LAMINATES

(75) Inventors: Ludovic L. Valette, Haguenau (FR); Catherine Marestin, Lyons (FR); Regis Mercier, Irigny (FR)

(73) Assignee: Dow Global Technologies Inc., Midland, MI (US)

( * ) Notice: Subject to any disclaimer, the term of this patent is extended or adjusted under 35 U.S.C. 154(b) by 402 days.

(21) Appl. No.: 11/017,558

(22) Filed: Dec. 20, 2004

(65) Prior Publication Data

US 2005/0158556 A1 Jul. 21, 2005

Related U.S. Application Data

(62) Division of application No. 10/456,127, filed on Jun. 6, 2003, now Pat. No. 6,855,738.

(51) Int. Cl.
*B32B 27/04* (2006.01)
*B32B 5/18* (2006.01)
*B32B 5/20* (2006.01)
*B32B 15/092* (2006.01)
*B32B 27/38* (2006.01)
*C08L 63/00* (2006.01)
*C08J 9/00* (2006.01)

(52) U.S. Cl. .................. 428/297.4; 521/50; 521/77; 525/523; 428/413; 428/414; 428/415; 428/416; 428/417; 428/418; 428/901

(58) Field of Classification Search .......... 428/297.4, 428/413, 414, 415, 416, 417, 418; 523/400; 525/523; 521/50, 77
See application file for complete search history.

(56) References Cited

U.S. PATENT DOCUMENTS

| | | | | |
|---|---|---|---|---|
| 3,223,654 A | | 12/1965 | Nickerson et al. ............ 260/2.5 |
| 3,264,152 A | * | 8/1966 | Haydon ........................ 216/20 |
| 3,615,960 A | | 10/1971 | Hoshli et al. .................. 156/49 |
| 3,649,572 A | | 3/1972 | Hairston et al. .............. 260/2.5 |
| 4,010,005 A | * | 3/1977 | Morisaki et al. ............ 428/607 |
| 4,798,848 A | | 1/1989 | Diethelm ...................... 521/89 |
| 4,882,399 A | * | 11/1989 | Tesoro et al. ................. 525/523 |
| 5,086,083 A | | 2/1992 | Franklin et al. .............. 521/129 |
| 5,116,883 A | | 5/1992 | LeMay ........................ 521/178 |
| 5,274,006 A | | 12/1993 | Kagoshima et al. ........... 521/85 |
| 5,310,619 A | * | 5/1994 | Crivello et al. ........... 430/270.1 |
| 5,322,893 A | * | 6/1994 | Moffett et al. ................. 525/64 |
| 5,670,250 A | | 9/1997 | Sanville, Jr. et al. ......... 428/323 |
| 6,630,520 B1 | | 10/2003 | Bruza et al. .................... 521/77 |
| 6,632,511 B2 | | 10/2003 | Zhang ........................ 428/209 |

FOREIGN PATENT DOCUMENTS

| EP | 0469584 A1 * | 2/1992 |
|---|---|---|
| EP | 0512401 | 11/1992 |
| FR | 2220564 | 11/1974 |

OTHER PUBLICATIONS

Gain, et al., "Synthesis and Characterization of Porous Polyimide Films for Dielectric Applications," American Chemical Society, 1995, vol. 623, Chapter 13, pp. 200-213.
Voit, et al., "Labile Hyperbranched Polymers Used as Nanopore-Forming Agents in Polymeric Dielectrica," Macromol, Symp., 2002, vol. 177, pp. 147-154.
Lawrence, S.A., "Di-tertiary-butyl dicarbonate," Chimica OGGI/ Chemistry Today, May/Jun. 1999, pp. 15-20.

* cited by examiner

*Primary Examiner*—Michael J Feely

(57) ABSTRACT

A process of making a nanoporous substrate, such as the matrix in an electrical laminate, by grafting onto an organic resin backbone a thermolabile functionality by reacting hydrogen active groups of the organic resin with a compound containing thermolabile groups; then thermally degrading the thermolabile groups grafted on the organic resin to form a nanoporous laminate. Advantageously, the nanoporous electrical laminate has a low dielectric constant (Dk) because of the nanopores present in the laminate matrix.

18 Claims, No Drawings

NANOPOROUS LAMINATES

FIELD OF THE INVENTION

This is a divisional application of U.S. Ser. No. 10/456,127, filed Jun. 6, 2003, now U.S. Pat. No. 6,855,735.

The present invention relates to a process for preparing nanoporous substrates, such as electrical laminates having a low dielectric constant.

BACKGROUND OF THE INVENTION

It is known to make electrical laminates and other composites from a fibrous reinforcement and an organic matrix resin such as an epoxy-containing matrix. Examples of suitable processes usually contain the following steps:

(1) An epoxy-containing formulation is applied to, or impregnated into, a substrate by rolling, dipping, spraying, other known techniques and/or combinations thereof. The substrate is typically a woven or nonwoven fiber mat containing, for instance, glass fibers or paper.

(2) The impregnated substrate is "B-staged" by heating at a temperature sufficient to draw off solvent in the epoxy formulation and optionally to partially cure the epoxy formulation, so that the impregnated substrate can be handled easily. The "B-staging" step is usually carried out at a temperature of from 90° C. to 210° C. and for a time of from 1 minute to 15 minutes. The impregnated substrate that results from B-staging is called a "prepreg." The temperature is most commonly 100° C. for composites and 130° C. to 200° C. for electrical laminates.

(3) One or more sheets of prepreg are stacked or laid up in alternating layers with one or more sheets of a conductive material, such as copper foil, if an electrical laminate is desired.

(4) The laid-up sheets are pressed at high temperature and pressure for a time sufficient to cure the resin and form a laminate. The temperature of this lamination step is usually between 100° C. and 230° C., and is most often between 165° C. and 190° C. The lamination step may also be carried out in two or more stages, such as a first stage between 100° C. and 150° C. and a second stage at between 165° C. and 190° C. The pressure is usually between 50 N/cm$^2$ and 500 N/cm$^2$. The lamination step is usually carried out for a time of from 1 minute to 200 minutes, and most often for 45 minutes to 90 minutes. The lamination step may optionally be carried out at higher temperatures for shorter times (such as in continuous lamination processes) or for longer times at lower temperatures (such as in low energy press processes).

Optionally, the resulting laminate, for example, a copper-clad laminate, may be post-treated by heating for a time at high temperature and ambient pressure. The temperature of post-treatment is usually between 120° C. and 250° C. The post-treatment time usually is between 30 minutes and 12 hours.

The current trend of the electrical laminates industry requires materials with improved dielectric properties including lower dielectric constant (Dk) and loss factor (Df); superior thermal properties including high glass transition temperature (Tg) and decomposition temperature (Td); and good processability.

Heretofore, various methods have been used to try to improve the dielectric constant of electrical laminates made from epoxy-containing resin compositions including, for example, by adding various thermoplastic additives, such as polyphenylene oxide (PPO), polyphenylene ether (PPE), or allylated polyphenylene ether (APPE), to the epoxy-containing resin composition.

It is desired to provide a new pathway to reduce the dielectric constant of electrical laminates made from organic resins. More particularly, it is desired to prepare modified organic resins, such as epoxy-containing resins, with thermolabile groups to lead to nanoporous matrixes upon curing.

SUMMARY OF THE INVENTION

The present invention is directed to a process of making a nanoporous matrix in an electrical laminate by grafting onto an organic resin backbone a thermolabile functionality by reacting the hydrogen active groups of the organic resin with a compound containing a thermolabile group; and then thermally degrading the thermolabile groups grafted on the organic resin, such that a nanoporous matrix is prepared. Such nanopores provide a low dielectric constant because of the air present in the nanopores and the lowest dielectric constant is for air.

In one embodiment, the present invention is directed to a process of making nanoporous epoxy-based electrical laminates by modifying the epoxy resin backbone with a thermolabile group through the reaction of the hydroxyl groups of the epoxy resin, and then by thermally degrading the thermolabile groups. Advantageously, the nanoporous electrical laminate has a low dielectric constant (Dk) because of the nanopores present in the matrix. The process of the present invention also provides the following benefits: a nanoporous matrix with a controlled dispersion of nanopores; a controlled size of nanopores; a close porosity; and a standard processability of the laminate.

DETAILED DESCRIPTION OF THE PREFERRED EMBODIMENTS

Generally, the process of the present invention includes, as a first step, reacting (a) an organic resin having hydrogen active groups with (b) a compound containing a thermolabile group, so as to graft the thermolabile group onto the backbone of the organic resin by the reaction of the compound containing the thermolabile groups with the hydrogen active groups of the organic resin.

In a second step, the thermolabile groups are degraded by subjecting the modified organic resin to a sufficient temperature, typically temperatures of from about 120° C. to about 220° C., to thermally degrade the thermolabile groups, which in turn produces nano size voids in the organic resin matrix. In laminate production, heating the organic resin for thermolabile group degradation is typically carried out during the pressing step of the laminate.

In one embodiment of the present invention, the organic resin may be selected from epoxy resins, phenolic resins, polimide resins, polyamide resins, polyester resins, polyether resins, bismaleimide triazine resins, cyanate ester resins, vinyl ester resins, hydrocarbon resins, and mixture thereof. The hydrogen active groups can be selected from, for instance, amines, phenols, thiols, hydroxyls or alcohols, amides, lactams, carbamates, pyrroles, mercaptans, imidazoles, and guanidine.

In another embodiment of the present invention, the compound containing a thermolabile group may be a dicarbonate and its derivatives, a carbazate and its derivatives, and other compounds containing tert-butyl carbonate. Examples of compounds containing thermolabile group are, but not limited to, di-tert-butyl dicarbonate, di-tert-amyl dicarbonate, diallyl pyrocarbonate, diethyl pyrocarbonate, dimethyl dicarbonate, dibenzyl dicarbonate, tert-butyl carbazate and mixtures thereof. The tert-butyl carbonate thermolabile group is advantageously stable to many nucleophiles and is not hydrolyzed under basic conditions, but it may be easily cleaved under mid-acidic conditions or by thermolysis.

In one particular example of the present invention, epoxy resins containing hydroxyl groups or phenolic resins can be advantageously used as the organic resin because epoxy resins are widely used in the electrical laminates industry and epoxy resins offer good processability. Di-tert-butyl dicarbonate can be conveniently used as the thermolabile group-containing compound because it is commercially available in large volumes.

In the present invention, the initial unmodified epoxy resin used may be any known epoxy resin chosen for its expected performance, for example, brominated or bromine-free standard or high Tg standard, or low Dk standard and the like. The thermolabile groups (also called "foaming agent") are grafted on the epoxy backbone through the reaction with the hydroxyl groups. The modified resin is stable at ambient temperature. During polymerization, thermolabile groups degrade, leading to gas generation which, in turn, produce voids in the polymerized epoxy resin matrix. Because the foaming agent is directly grafted onto the epoxy molecule, the statistical repartition of the voids is highly improved in comparison to the addition of non-grafted foaming agents. As a consequence, the voids in the epoxy matrix are smaller (e.g., the diameter of the voids may be less than 200 nm) and well-dispersed within the laminate. The continuous epoxy matrix gives thermal resistance and mechanical integrity to the system, whereas the voids decrease the dielectric constant, resulting in low Dk electrical laminates. For example, generally, laminates having a Dk measured at 1 GHz of less than 5 may be obtained, however, laminates having a Dk measured at 1 GHz of less than 4.2, preferably less than 4.0, more preferably less than 3.8, even more preferably less than 3.5, may be obtained.

In one embodiment of the present invention, an epoxy resin is reacted directly, in an aprotic solvent, with a compound containing a thermolabile group to form a modified epoxy resin.

In another embodiment of the present invention, the thermolabile group is first reacted with a phenolic compound and then the resulting reaction product, a modified phenolic compound, is used as a curing agent to react with an epoxy resin, such as to introduce the thermolalide groups into the epoxy resin and form a modified epoxy resin.

The amount of thermolabile group used is selected such that the weight percent of thermolabile groups in a final formulation or varnish composition is from about 0.01 weight percent (wt %) to about 10 wt %, preferably from about 0.1 wt % to about 5 wt %, and more preferably from about 0.2 wt % to about 2.5 wt %. The weight percentage of the composition above is given based on solids.

Optionally, a catalyst can be added to the composition to accelerate the reaction between the compound containing the thermolabile group and the hydrogen active groups of the organic resin. For example, hydroxylamine is known to catalyze the tertiary butoxy carbonylation of alkylamines at room temperature (~25° C.). In another example, dimethyl aminopyridyne acts as a catalyst for the reaction between hydroxyl groups or phenols and di-tert-butyl dicarbonate at room temperature. Other catalysts useful in the present invention include, for example, auxiliary bases such as triethylamine or N,N-diisopropylethylamine.

To prepare a modified epoxy resin of the present invention, an epoxy resin having an average of more than one epoxy group per molecule and, on average, more than zero hydroxyl group per molecule may be used. The epoxy resin may be selected from (1) an epoxy resin having an average of more than one epoxy groups per molecule and, on average, one or more hydroxyl groups per molecule, (2) a mixture of (1) and an epoxy resin having an average of more than one epoxy groups per molecule but no hydroxyl groups. The exact selection of the epoxy resin component is determined from the intended properties of the final products. Suitable epoxy resins, as used herein, include, for example, those having an epoxy equivalent weight of about 170 to about 3,500. Such epoxy resins are well described in, for example, U.S. Pat. Nos. 4,251,594; 4,661,568; 4,710,429; 4,713,137; and 4,868,059, and *The Handbook of Epoxy Resins* by H. Lee and K. Neville, published in 1967 by McGraw-Hill, New York, all of which are incorporated herein by reference.

Epoxy resins, which can be used as one epoxy resin component in the present invention, may be represented by the general Formula (I):

Formula I:

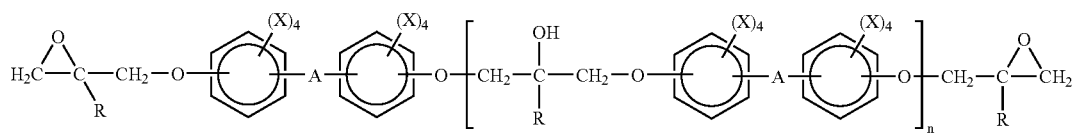

wherein A is independently a divalent chemical bond, a divalent hydrocarbon group suitably having from 1 to about 10, preferably from 1 to about 5, more preferably from 1 to about 3 carbon atoms, —S—, —S—S—, —SO—, —SO$_2$—, —CO— or —O—; each R is independently a hydrogen atom or an alkyl group suitably having from 1 to about 3 carbon atoms; each X is independently a hydrogen atom or an alkyl group suitably having from 1 to about 10, preferably from 1 to about 5, more preferably from 1 to about 3 carbon atoms, or a halogenated atom such as Br or Cl; and n is a number lower than about 12.

To further improve heat resistance, the epoxy resin component used in the present invention may comprise a multi-functional epoxy resin having an average of more than two epoxy groups per molecule. Preferred multi-functional epoxy resins include, for example, cresol-formaldehyde novolac epoxy resin, phenol-formaldehyde novolac epoxy resin, bisphenol A novolac epoxy resin, dicyclopentadiene phenol Novolac epoxy resin, tris(glycidyloxyphenyl)methane, tetrakis(glycidyloxyphenyl)ethane, tetraglycidyldiaminodiphenylmethane and mixtures thereof. To prevent the resultant reaction product from having high viscosity, tris(glycidyloxyphenyl)methane, tetrakis(glycidyloxyphenyl)ethane and tetraglycidyldiaminodiphenylmethane are preferred. In view of cost performance, a cresol-formaldehyde novolac epoxy resin, phenol-formaldehyde novolac epoxy resin and bisphenol A novolac epoxy resin are preferred. In view of dielectric performance, dicyclopentadiene phenol novolac epoxy resin is preferred. In addition, it is preferable to use a multifunctional epoxy resin having narrow molecular weight distribution (e.g., a Mw/Mn value of from about 1.5 to about 3.0).

Optionally, a suitable organic solvent can be used during the preparation of the modified organic resin of the present invention to lower the viscosity of the resin. Suitable organic solvents useful in the present invention include solvents that do not contain hydrogen active groups. Preferably, aprotic solvents may be conveniently used, such as, for example, ketones such as acetone, methyl ethyl ketone (MEK), and methyl isobutyl ketone; acetate of glycol ethers such as propylene glycol monomethyl ether acetate (DOWANOL PMA); aromatic organic solvents such as toluene and xylene; aliphatic hydrocarbons; cyclic ethers; halogenated hydrocarbons; and mixtures thereof.

In one specific embodiment for illustration purposes, thermolabile t-butyloxycarbonyl groups may be grafted onto an epoxy backbone through the reaction with hydroxyl groups. For example, brominated epoxy resins such as D.E.R. 560 or D.E.R. 539-EK80 and non-brominated epoxy resins such as D.E.R. 669E, all commercially available from The Dow Chemical Company, may be successfully modified in industrial solvents such as MEK or DOWANOL PMA.

In another specific embodiment, phenolic resins and phenolic derivatives may also be modified according to the present invention. A few examples of commercially available phenolic resin include cresol novolac; bisphenol A novolac such as BPN17, commercially available from Arakawa; and mixtures thereof. Examples of phenolic derivatives include bisphenol A, bisphenol F, bisphenol S, tetrabromo bisphenol A, hydroquinone, and mixtures thereof. Other phenolic resins and phenolic derivatives including dihydric phenols, halogenated dihydric phenols, polyhydric phenols, and halogenated polyhydric phenols useful in the present invention are described in PCT Application WO 01/42359A1 and *The Handbook of Epoxy Resins* by H. Lee and K. Neville, published in 1967 by McGraw-Hill, New York, all of which are incorporated herein by reference.

It is noteworthy that the organic resin shows generally a lower viscosity in organic solvent after modification. Although not wishing to be bound by any theory, it would appear that the lower solution viscosity could be due to the decrease of the hydrogen-bonding effect, because of the grafting of the thermolabile group of the hydroxyl functionalities.

In another specific embodiment for illustration purposes, epoxy resins are partly or fully modified to epoxy carbonate resins, for example, by carbonation of the epoxy group of an epoxy resin under $CO_2$ pressure at the appropriate temperature, such as, for example, 80° C. with an adequate ion exchange resin. Such epoxy carbonate resins can be used as the epoxy resin component to obtain modified epoxy resins with thermolabile groups.

The modified epoxy resins are advantageously used in producing a laminate. During the pressing stage of a laminate, for example, at 180° C., the thermolabile groups degrade and generate volatile products, creating a porous matrix within the laminate resulting in a laminate with a reduced dielectric constant. Most of the key properties of systems using the present invention are not changed by the modified resins, such as varnish reactivity, prepreg processability, and laminate performances, such as thermal properties, flame retardancy, drillability, chemical cleaning, and etching, and the like. However, the dielectric constant of the resulting laminate is advantageously reduced. Nanoporous laminates of the present invention may show an improvement of up to 20% compared to the same epoxy system without nanopores. Because the foaming agent is directly grafted onto the epoxy molecule, voids are small (for example, 60 nm or less) and well-dispersed within the laminate. For optimized processing conditions, the resulting laminate is homogeneous and, depending on the formulation, may be transparent, opalescent or opaque.

Additional advantages for laminators using the modified epoxy resins of the present invention are that laminators can produce laminates with improved dielectric constants, while at the same time, laminators can carry on their expertise generated with previously existing epoxy products, i.e., same requirements for material handling, same formulation techniques, and same production conditions. Moreover, laminators can use current glass reinforcements and copper foils. The registration of the laminates remains the same.

Additional advantages for producers of printed circuit boards, which incorporate the modified epoxy resins of the present invention, are that producers can use production conditions that are similar to previously existing epoxy systems. Producers can also obtain higher flexibility in systems design because they can tailor the dielectric constants of the same base material depending on the level of porosity.

The epoxy resin compositions of the present invention may comprise, as an optional component, catalysts for catalyzing the reaction of the epoxy groups of the epoxy resin and the hydroxyl groups of the curing agent. Such catalysts are described in, for example, U.S. Pat. Nos. 3,306,872; 3,341,580; 3,379,684; 3,477,990; 3,547,881; 3,637,590; 3,843,605; 3,948,855; 3,956,237; 4,048,141; 4,093,650; 4,131,633; 4,132,706; 4,171,420; 4,177,216; 4,302,574; 4,320,222; 4,358,578; 4,366,295; and 4,389,520.

Examples of the suitable catalysts are imidazoles such as 2-methylimidazole; 2-phenyl imidazole and 2-ethyl-4-methyl imidazole; tertiary amines such as triethylamine, tripropylamine and tributylamine; phosphonium salts such as ethyltriphenylphosphonium chloride, ethyltriphenylphosphonium bromide and ethyltriphenylphosphonium acetate; and ammonium salts such as benzyltrimethylammonium chloride and benzyltrimethylammonium hydroxide, and mixtures thereof. The amount of the catalysts used in the present invention generally ranges from about 0.001 weight percent to about 2 weight percent, and preferably from about 0.01 to about 0.5 weight percent, based on the total weight of the reaction mixture.

In another specific embodiment for illustration purposes, imidazoles may be partly or fully modified with a compound containing a thermolabile group to form a latent catalyst.

The epoxy resin composition of the present invention may comprise known curing agents. Such curing agents include, for example, amine-curing agents such as dicyandiamide, diaminodiphenylmethane and diaminodiphenylsulfone; anhydrides such as hexahydroxyphthalic anhydride and styrene-maleic anhydride coplymers; imidazoles; and phenolic curing agents such as phenol novolac resins; and mixtures thereof. Such curing agents can be added to the composition immediately before curing, or can be included in the composition from the beginning if they are latent. The amount of the curing agents used may normally range from about 0.3 to about 1.5 equivalent per epoxy equivalent of the epoxy components, and preferably from about 0.5 to about 1.1 equivalent per epoxy equivalent of the epoxy components.

Imidazoles can be used to promote epoxy homopolymerization. Depending on the varnish composition, a pure homopolymerized epoxy network can be obtained, or a hybrid network can be formed between the homopolymerized epoxy and the epoxy/hardener network.

The epoxy resin composition may also include a suitable organic solvent component to make handling of the epoxy resin varnish easier, and such solvents are added to lower the viscosity of the above compositions. Known organic solvents can be used. The solvents useful in the present invention include, for example, ketones such as acetone and methyl ethyl ketone; alcohols such as methanol and ethanol; glycol ethers such as ethylene glycol methyl ether and propylene glycol monomethyl ether; acetate of glycol ethers such as propylene glycol monomethyl ether acetate; amides such as N,N-dimethylformamide; aromatic organic solvents such as toluene and xylene; aliphatic hydrocarbons; cyclic ethers; and halogenated hydrocarbons.

In the practice of the present invention, the amount of the organic solvent employed may range from about 10 to about 60 parts by weight, and preferably from about 20 to about 40 parts by weight, based on 100 parts by weight of the above epoxy resin composition.

To improve storage stability, the epoxy resin compositions of the present invention may comprise a suitable stabilizer. Suitable stabilizers, as used herein, include, for example, alkylphenylsulfonates or halogenated alkylphenylsulfonates such as methyl-p-toluenesulfonate, ethyl-p-toluenesulfonate and methyl-p-chlorobenzenesulfonate. A preferred suitable stabilizer used in the present invention is methyl-p-toluenesulfonate. The stabilizer may suitably be used in an amount of from about 0.001 to about 10 weight percent, and more suitably from about 0.01 to about 2 weight percent, based on the total amount of the composition.

As desired, the epoxy resin compositions of the present invention may comprise an effective amount of other commonly employed additives for epoxy resins, for example, a reaction accelerator, pigment, dye, filler, surfactant, viscosity controller, flow modifier, flame retardant and mixtures thereof.

A process for preparing an electrical laminate using an organic resin composition of the present invention will be described below.

In a first step, the organic resin composition of the present invention is prepared by contacting an appropriate amount of the organic resin with the compound containing the thermolabile group, and with optional additives, such as solvent and catalyst; and reacting the mixture to modify the organic resin to introduce the thermolabile groups into the back bone of the organic resin resulting in a modified organic resin.

The reaction conditions for the above reaction are selected to insure an efficient reaction between the compound containing the thermolabile group and the hydrogen active group of the organic resin. The reaction temperature is usually limited by the thermal stability of the thermolabile compound. The reaction generally processes around room temperature (about 25° C.), but can be from about 10° C. to about 50° C., preferably between about 15° C. and about 40° C., and more preferably between about 20° C. and about 35° C.; for a period of from about 0.1 hour (h) to about 72 h, preferably from about 0.2 h to about 24 h, and more preferably from about 0.5 h to about 12 h.

In a subsequent step, the above-modified organic resin, a curing agent and other desired additives are mixed to prepare a varnish. The varnish is then impregnated into a substrate or web. The obtained impregnated substrate is dried at, for example, from about 90° C. to about 210° C., and preferably about 130° C. to about 200° C.; for about 0.5 minute to about 60 minutes, and preferably from about 0.5 minute to about 30 minutes to obtain an organic resin-based prepreg. As used herein, the substrate may include, for example, glass cloth, glass fiber, glass paper, paper, and similar organic substrates such as polyethylene, polypropylene, aramid fibers and polytetrafluoroethylene (PTFE) fibers.

In one specific embodiment of the present invention, the impregnated substrate is dried below the decomposition temperature of the grafted thermolabile group. Consequently, no foaming or very limited foaming occurs during the drying stage, resulting in a prepreg with an improved cosmetic aspect.

The obtained prepreg is then cut into a desired size. One single cut prepreg or a plurality of cut prepregs (desired number, e.g., 2 to 10 pieces) are laminated and subjected to pressing at a pressure of, for example, from about 1 kgf/cm$^2$ to about 50 kgf/cm$^2$, and preferably from about 2 kgf/cm$^2$ to about 40 kgf/cm$^2$; at a temperature of, for example, from about 120° C. to about 220° C.; for a period of time of, for example, from about 0.5 hour to about 3 hours to obtain a laminate. During this heating step the thermolabile groups are degraded and nanopores are formed in the laminate.

In one embodiment, multi-stage pressing can be advantageously used during lamination. As an illustration, a lower pressure of, for example, from about 1 kgf/cm$^2$ to about 10 kgf/cm$^2$, may be first applied at a lower temperature of, for example, from about 120° C. to about 160° C., for a period of, for example, from about 0.1 h to about 1 h. Then, full pressure of, for example, from about 5 kgf/cm$^2$ to about 50 kgf/cm$^2$, may be applied at a higher temperature of, for example, from about 160° C. to about 220° C., for a period of time of, for example, from about 0.5 h to about 2 h. Multi-stage pressing can be used to control the morphology of the nanoporous laminate. It has been generally observed that, for a given volume fraction of voids, smaller and better dispersed pores lead to lower Dk than bigger and more aggregated pores.

An electrical conductive layer may be formed on the laminate with an electrical conductive material. As used herein, suitable electrical conductive materials include, for example, electrical conductive metals such as copper, gold, silver, platinum and aluminum.

In another specific embodiment of the present invention, metal foil, such as copper foil, may be coated by the organic resin varnish of the present invention. The varnish then may be partly cured (B-stage) or fully cured (C-stage) to obtain a resin coated metal foil, such as resin coated copper foil.

The electrical laminates manufactured, as described above, can be preferably used as copper clad laminates and multi-layer printed circuit boards for electrical or electronics equipment.

The present invention will be described in more detail with reference to the following Examples and Comparative Examples, which are not to be construed as limiting. Unless otherwise indicated, "part" means "part by weight".

The raw materials used for the chemical modifications and for the varnish formulations in the Examples which follow were as follows:

D.E.R. 560 is a brominated epoxy resin, with an epoxy equivalent weight (EEW) of 450, commercially available from The Dow Chemical Company.

MEK stands for methyl ethyl ketone.

D.E.R. 539-EK80 is a brominated epoxy resin (80% non-volatile (N.V.) in MEK), with an EEW of 450, commercially available from The Dow Chemical Company.

DIBOC stands for di-tert-butyl dicarbonate, and is commercially available from Aldrich.

DMAP stands for dimethyl amino pyridine, and is commercially available from Aldrich.

DOWANOL PM is a propylene glycol monomethyl ether, commercially available from The Dow Chemical Company.

DOWANOL PMA is a propylene glycol monomethyl ether acetate, commercially available from The Dow Chemical Company.

DMF stands for dimethylformamide.

MeOH stands for methanol.

DICY stands for dicyandiamide (10% N.V. in DOWANOL PM/DMF 50/50).

2-MI stands for 2-methylimidazole (20% N.V. in MeOH).

2E-4MI stands for 2-ethyl-4-methylimidazole (20% N.V. in MEK or MeOH).

2-PhI stands for 2-phenylimidazole (20% N.V. in MeOH).

Boric acid ($H_3BO_3$) is used as 20% N.V. in MeOH.

Perstorp 85.36,28 is a phenol novolac (n=4.5-5) (50% N.V. in DOWANOL PMA), with a hydroxyl equivalent weight (HEW) of 104, commercially available from Perstorp.

D.E.N. 438 is an epoxy novolac (n=3.6) (80% N.V. in MEK), with an EEW of 180, commercially available from The Dow Chemical Company.

EPPN502H is an epoxy novolac (80% N.V. in MEK), with an EEW of 170, commercially available from Nippon Kayaku.

MDI stands for 4,4'-methylenebis(phenyl isocyanate).

XZ 92505 is an epoxy/MDI flow modifier (50% N.V. in DMF), with an EEW of 850, commercially available from The Dow Chemical Company.

XZ 92528 is a bromine-free epoxy resin (75% N.V. in MEK/DOWANOL PM), with an EEW of 325, commercially available from The Dow Chemical Company.

SMA 3000 is a styrene-maleic anhydride copolymer solution (50% N.V. in DOWANOL PMA/MEK), with an anhydride equivalent weight (AnhEW) of 393, commercially available from Atofina.

RICON 130MA13 is a maleinized polybutadiene, with an average molecular weight (Mn) of 2900, and an AnhEW of 762, commercially available from Sartomer.

SBM 1A17 is a styrene-butadiene-methyl methacrylate triblock polymer, commercially available from Atofina.

E.R.L. 4299 is a cycloaliphatic epoxy resin, with an EEW of 195, commercially available from The Dow Chemical Company.

BPN17 is a bisphenol A phenol novolac, with a phenol equivalent weight of 120, commercially available from Arakawa Chemicals.

E-BPAPN is an epoxydized bisphenol-A phenol novolac, 79.6% solids in acetone with an EEW of 197 (based on solids), commercially available from The Dow Chemical Company.

TBBA stands for tetrabromo bisphenol-A.

D.E.R. 330 is a diglycidyl ether of bisphenol-A, with an EEW of 180, commercially available from The Dow Chemical Company.

D.E.R. 6615 is a solid epoxy resin, with an EEW of 550, commercially available from The Dow Chemical Company.

XZ-92535 is a phenol novolac solution, 50% solids in DOWANOL PMA, with a hydroxyl equivalent weight (OHEW) of 104, commercially available from The Dow Chemical Company.

D.E.R. 592-A80 is a brominated epoxy resin solution, 80% solids in acetone, with an EEW of 360 (based on solids), commercially available from The Dow Chemical Company.

D.E.R. 669E is a high molecular weight diglycidyl ether of bisphenol-A, with an EEW of 3245, commercially available from The Dow Chemical Company.

XZ-92567.01 is a brominated epoxy resin solution, EEW of 385, commercially available from The Dow Chemical Company.

XZ-92568.01 is an anhydride hardener solution, with an EW of 398, commercially available from The Dow Chemical Company.

DMTA stands for dynamic mechanical thermal analysis.

The anhydride hardener solution ("AH1") used in the examples was prepared as follows:

An anhydride hardener solution (AH1) was prepared in a 10 L stainless steel reactor, equipped with a mechanical stirrer, and a heating jacket; and fitted with a $N_2$ inlet and a dropping funnel. 3671.9 Grams of DOWANOL PMA and 3623.2 grams of solid SMA 3000 were charged into the reactor and the mixture was heated to 90° C. After complete dilution, 730.7 grams of RICON 130MA13 was incorporated into the resulting solution. The resulting solution turned white turbid. After 30 minutes, the resulting solution was allowed to cool down to 80° C. and 974.2 grams of an SBM 1A17 solution in MEK (15% non-volatile) was introduced into the solution in the reactor at 80° C. After complete cooling at ambient temperature, the resulting anhydride hardener solution was turbid whitish homogeneous. The theoretical anhydride equivalent weight was 439 (based on solids).

The properties of the resultant laminates were tested using the following testing methods and apparatuses:

(a) Dielectric Measurements

A Hewlett Packard Analyzer was used to measure Dk and Df in air, at ambient temperature, from 1 MHz to 1 GHz. Sample size was about 10 cm×10 cm with a thickness of about 1.5 mm.

(b) Nuclear Magnetic Resonance (NMR) Measurements

A Brucker apparatus operating at 250 MHz was used to determine $^1$H- and $^{13}$C-NMR spectra.

(c) Thermogravimetry Analysis (TGA)

A DuPont apparatus TGA V5.1A was used to determine the weight loss of modified epoxy resins from ambient temperature to 300° C.

(d) Optical Microscopy

100 μm thin sections were prepared with a rotating diamond saw. The sections were studied with a LEICA POLYVAR 2 light microscope operating with transmitted light and differential interference contrast according Nomarski. Images were captured with a Polaroid DMC digital camera.

(e) Transmission Electron Microscopy (TEM)

A glass fiber free epoxy area was sectioned perpendicular to the glass bundles with a LEICA ULTRACUT E ultramicrotome using a 45 degrees diamond knife. The section thickness was 120 nm (setting). Sections were studied with a CM12 transmission electron microscope operating at 120 kV. Sections were collected onto cleaned, 300 mesh copper grids. Imaging was recorded digitally in a Hitachi H-600 TEM at 100 kV. TEM micrographs were made of representative areas of the sections.

The standard methods used in the Examples to measure certain properties are as follows:

| IPC Test Method | Property Measured |
| --- | --- |
| IPC-TM-650-2.3.10B | Flammability of laminate [UL94] |
| IPC-TM-650-2.3.16.1C | Resin content of prepeg, by treated weight [resin content] |
| IPC-TM-650-2.3.17D | Resin flow percent of prepeg [resin flow] |
| IPC-TM-650-2.3.18A | Gel time, prepreg materials [prepreg gel time] |
| IPC-TM-650-2.3.40 | Thermal stability [Td] |
| IPC-TM-650-2.4.8C | Peel strength of metallic clad laminates [copper |

| IPC Test Method | Property Measured |
|---|---|
| | peel strength] |
| IPC-TM-650-2.4.24C | Glass transition temperature and z-axis Thermal expansion by Thermal Mechanical Analysis (TMA) [Coefficient of Thermal Expansion (CTE)] |
| IPC-TM-650-2.4.24.1 | Time to delamination (TMA Method) [T260, T288, T300] |
| IPC-TM-650-2.4.25C | Glass transition temperature and cure factor by DSC [Tg] |
| IPC-TM-650-2.5.5.9 | Permittivity and loss tangent, parallel plate, 1 MHz to 1.5 GHz [Dk/Df measurements] |
| IPC-TM-650-2.6.8.1 | Thermal stress, laminate [solder float test] |
| IPC-TM-650-2.6.16 | Pressure vessel method for glass epoxy laminate integrity [high pressure cooker test (HPCT)] |

EXAMPLE 1

A brominated epoxy resin, D.E.R. 560, was chemically modified with di-tert-butyl dicarbonate groups using the following composition:

| Component | Amount |
|---|---|
| D.E.R. 560 | 250 g |
| DIBOC | 30.4 g |
| DMAP | 1.01 g |
| dichloromethane | 200 g |

A. Procedure of the Chemical Modification

The epoxy resin was first dissolved in dichloromethane ($CH_2Cl_2$) at 25° C. in an Erlenmeyer flask with a magnetic stirrer. After complete dilution, solid di-ter-butyl dicarbonate was added to the resulting solution. Then a solution of dimethyl amino pyridine in dichloromethane was slowly charged into the solution in the flask. The resulting solution was stirred at ambient temperature for about 18 hours to ensure complete conversion.

The dichloromethane was evaporated in a ROTAVAPOR under vacuum, from ambient temperature to 50° C. The dry resin was solid at room temperature.

B. Nuclear Magnetic Resonance (NMR) Characterization of the Modified Brominated Epoxy Resin The $^1$H-NMR and $^{13}$C-NMR spectra confirmed that chemical modification of the brominated epoxy resin and the grafting of the di-tert-butyl dicarbonate groups onto the resin had occurred.

$^1$H-NMR disappearance of —OH at 3.02 ppm $^{13}$C-NMR disappearance of carbon

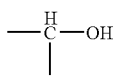

at 69.6 ppm and shift toward carbon

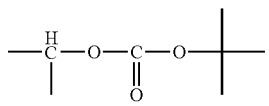

appearance of methyl groups from tertio-butyl

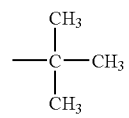

at 27.84 ppm appearance of quaternary carbon

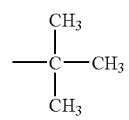

at 82.44 ppm appearance of carbonyl

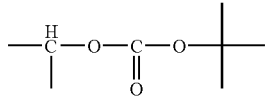

at 152.79 ppm

These peaks are not due to free di-ter-butyl dicarbonate because the carbonyl would appear at 146.5 ppm instead of 152.8 ppm.

C. Thermal Characterization of the Modified Brominated Epoxy Resin

The thermal characterization was done by TGA.

Before modification, D.E.R. 560 was stable to >200° C. D.E.R. 560 started to decompose around 230° C.-250° C. because of the standard thermolysis of the bromine groups.

Modified D.E.R. 560 started to decompose at lower temperature because of the thermolabile groups. A significant weight loss was seen between 170° C. and 220° C. (4.77%), before the degradation of the bromine groups. The weight loss was due to the thermal breakdown of the thermolabile carbonate groups grafted onto the resin backbone, leading to $CO_2$ and isobutene evaporation. At higher temperature (T>230° C.-250° C.), the standard thermolysis of the bromine groups finally occurred.

Three other TGA runs were performed with different isotherm profiles. The resin weight loss was measured at the end of the isotherm:

(1) At the end of the isotherm at 180° C. for 4 minutes, the weight loss was 0.72%;
(2) At the end of the isotherm at 185° C. for 60 minutes, the weight loss was 4.48%; and
(3) At the end of the isotherm at 160° C. for 60 minutes, the weight loss was 1.14%.

EXAMPLES 2A-2D

A brominated epoxy resin, D.E.R. 560, was modified with di-tert-butyl dicarbonate groups using the same chemical modification procedure used in Example 1, except with the compositions as show in Table I below.

TABLE I

| Component | Example 2A | Example 2B | Example 2C | Example 2D |
|---|---|---|---|---|
| D.E.R. 560 (g) | 250 | 250 | 250 | 250 |
| MEK (g) | 118 | 118 | 118 | |
| DOWANOL PMA (g) | | | | 118 |
| DIBOC (g) | 30.4 | 30.4 | 30.4 | 30.4 |
| DMAP (g) | 0.51 | 0.17 | 0.085 | 0.085 |

The modified resins in MEK or DOWANOL PMA could be used directly after modification, without stripping the reaction solvent.

TGA and NMR results on dried samples confirmed the modification of the epoxy resins.

EXAMPLE 3

A brominated epoxy resin, D.E.R. 560, was chemically modified with di-tert-butyl dicarbonate groups using the same chemical modification procedure as the one described in Example 1, except using the following composition:

| Component | Amount |
|---|---|
| D.E.R. 560 | 2452.4 g |
| DIBOC | 147.2 g |
| DMAP | 0.41 g |
| DOWANOL PMA | 1400.1 g |

Di-tert-butyl dicarbonate was charged to a reactor at ambient temperature within 3 hours, and then the solution was kept at ambient temperature for 4 hours.

The modified resin was used without further purification, and without stripping the DOWANOL PMA from the resin.

EXAMPLES 4A AND 4B

A brominated epoxy resin, D.E.R. 539-EK80, was partially modified with di-tert-butyl dicarbonate groups using the composition as shown in Table II below.

TABLE II

| Component | Example-4A | Example-4B |
|---|---|---|
| D.E.R. 539-EK80 (g) | 617 | 416 |
| MEK (g) | 54 | 24 |
| DIBOC (g) | 96 | 133 |
| DMAP (g) | 0.285 | 0.372 |
| PROPERTIES | | |
| weight loss between 170° C. and 220° C., measured by TGA (%) | 6.6 | 14.1 |

The NMR spectra showed that the chemical modification was successful and that no residual di-tert-butyl dicarbonate remained in the solution. NMR spectra also showed a portion of unreacted secondary hydroxyl groups because of the under-stochiometric amount of di-tert-butyl dicarbonate.

EXAMPLE 5

In this Example, bisphenol A, a phenolic compound, was chemically modified with di-tert-butyl dicarbonate groups according to the procedure described in Example 1. The composition used was as follows:

| Component | Amount |
|---|---|
| bisphenol-A | 114 g |
| DIBOC | 109 g |
| DMAP | 3.66 g |
| dichloromethane | 200 g |

NMR, DSC and TGA characterization confirmed that bisphenol-A was regenerated after heating to 220° C. and that degradation of the carbonate groups occurred.

EXAMPLE 6

In this Example, a multifunctional phenol novolac resin, Perstorp 85.36,28, was chemically modified in MEK with di-tert-butyl dicarbonate groups, using the procedure described in Example 1. Di-tert-butyl dicarbonate was charged with an under-stochiometric ratio, therefore, only part of the phenolic groups were modified. The composition was as follows:

| Component | Amount |
|---|---|
| Perstorp 85.36,28 | 2.03 g |
| DIBOC | 0.24 g |
| DMAP | 0.67 mg |
| MEK | 2.9 g |

The successful modification was confirmed by NMR measurement. After heating to 220° C. and degradation of the carbonate groups, phenolic —OH groups are regenerated.

COMPARATIVE EXAMPLES I AND II

In these Comparative Examples, azodicarbonamide, a known foaming agent, was used as an additive foaming agent and not grafted onto the organic resin; and compared with a reference material without azodicarbonamide or any other foaming agent as described in Table III below.

The incorporation of azodicarbonamide as a foaming agent into a resin leads to a non-stable varnish (precipitation overnight) and a non-homogeneous laminate (macrobubbles which leads to delamination).

TABLE III

|  | Comparative Example I (reference) | Comparative Example II (with azodicarbonamide) |
|---|---|---|
| FORMULATION | | |
| XZ 92528 [75% N.V. in MEK/DOWANOL PM] (g) | 31.9 | 31.9 |
| azodicarbonamide (g) | | 0.35 |
| DICY [10% in DMF/DOWANOL PM] (g) | 4.76 | 4.76 |
| 2-PhI [20% N.V. in MeOH] (g) | 1.18 | 1.18 |
| PROPERTIES | | |
| stroke cure reactivity @ 170° C. (s) | 241 | 224 |
| film Tg (° C.) | 131 | 131 |
| varnish appearance | clear yellow solution | opaque orange dispersion, precipitation overnight |
| pressing conditions | 90 minutes @ 185° C., 125 N/cm$^2$ | 90 minutes @ 185° C., 125 N/cm$^2$ |
| LAMINATE PROPERTIES | | |
| laminate resin content (%) | 42 | 41 |
| laminate appearance | yellow transparent | whitish opaque, inhomogeneous, large bubbles between layers, delamination |

EXAMPLES 7A AND 7B

In these Examples, a modified brominated epoxy resin, modified D.E.R. 560, was used to prepare electrical laminate formulations, as described in the following Table IV.

TABLE IV

|  | Example 7A (50% modified D.E.R. 560) | Example 7B (100% modified D.E.R. 560) |
|---|---|---|
| FORMULATION | | |
| D.E.N. 438 [80% N.V. in MEK] (g) | 31.53 | 36.03 |
| D.E.R. 560 [70% N.V. in cyclohexanone] (g) | 17.29 | |
| modified D.E.R. 560 [70% in cyclohexanone] (g) | 17.29 | 39.53 |
| Perstorp 85.36,28 [50% N.V. in DOWANOL PMA] (g) | 40.34 | 46.10 |
| DOWANOL PMA (g) | 2.67 | 3.06 |
| boric acid solution [20% in MeOH] (g) | 1.22 | 1.39 |
| 2E-4MI [20% N.V. in MeOH] (g) | 0.77 | 0.88 |
| PROPERTIES | | |
| stroke cure reactivity @ 170° C. (s) | 231 | 248 |
| film Tg (° C.) | 184 | 183 |
| PREPREG PROPERTIES | | |
| prepreg resin content (%) | 45 | 47 |
| prepreg residual gel time (s) | 98 | 65 |
| pressing conditions | 90 minutes @ 185° C. 40 N/cm$^2$ | 90 minutes @ 185° C. 40 N/cm$^2$ |
| LAMINATE PROPERTIES | | |
| laminate color | whitish translucent | white opaque |
| laminate Tg (° C.) | 178 | 182 |

The above results show that the modified D.E.R. 560, prepared according to Example 1, did not change the reactivity of the resin and Tg remained similar. Also, no thermal degradation was observed during a DSC scan of the fully cured laminate sample up to 230° C., which means that all thermolabile groups were degraded during the pressing stage. By increasing the amount of modified D.E.R. 560, the appearance of the laminate changed from whitish translucent to white opaque because of bigger and more numerous pores.

EXAMPLES 8A AND 8B AND COMPARATIVE EXAMPLE III

In these Examples, various amounts of modified D.E.R. 560, prepared according to Example 1, were used in resin formulations, as described in Table V below.

TABLE V

|  | Comparative Example III (0% modified D.E.R. 560) | Example 8A (50% modified D.E.R. 560) | Example 8B (100% modified D.E.R. 560) |
| --- | --- | --- | --- |
| FORMULATION |  |  |  |
| D.E.N. 438 [80% N.V. in MEK] (g) | 234.7 | 122.5 | 180.1 |
| D.E.R. 560 [70% N.V. in cyclohexanone] (g) | 256.3 | 71.2 |  |
| modified D.E.R. 560 [70% in cyclohexanone] (g) |  | 71.2 | 197.6 |
| Perstorp 85.36,28 [50% N.V. in DOWANOL PMA] (g) | 299.9 | 165.3 | 230.5 |
| XZ 92505 [50% N.V. in cyclohexanone] (g) |  | 56.1 |  |
| DOWANOL PMA (g) |  |  | 15.0 |
| boric acid solution [20% in MeOH] (g) | 9.05 | 4.91 | 6.96 |
| 2E-4MI [20% N.V. in MeOH] (g) | 5.17 | 3.36 | 4.77 |
| PROPERTIES |  |  |  |
| stroke cure reactivity @ 170° C. (s) | 234 | 215 | 235 |
| prepreg aspect | shiny | shiny | slightly foamy |
| pressing conditions | 90 minutes @ 190° C. 40 N/cm$^2$ | 90 minutes @ 190° C. 48 N/cm$^2$ | 90 minutes @ 190° C. 7 N/cm$^2$ |
| LAMINATE PROPERTIES |  |  |  |
| color | yellow | pale yellow translucent | white opaque |
| high pressure cooker test time/H$_2$O pick-up/% pass 20 s solder | 180 minutes/ 0.27%/100% pass | 120 minutes/ 0.39%/100% pass | 180 minutes/ 0.41%/0% pass |
| T288 (minutes) | 15 | 10 | 13 |
| Cu peel (N/cm) | 14.6 | 13.6 | 14.1 |
| solder dip @ 288° C. (s) | >180 | 103/106 | 4/5 |
| solder float @ 288° C. (s) | >180 | 118/116 | 3/2 |
| UL94 rating | V-0 | V-0 | V-0 |
| Dk @ 1 GHz, 25° C. | 4.95 | 4.08 | 3.93 |
| Df @ 1 GHz, 25° C. | 0.018 | 0.020 | 0.021 |

The above results show that the use of modified D.E.R. 560, prepared according to Example 1, did not change the reactivity of the varnish and thermal stability remained similar. The modified brominated epoxy resin D.E.R. 560 still acted as an efficient fire retardant (UL94 V-0). The increase of modified D.E.R. 560 changed the appearance of the laminate, from clear yellow to white opaque, due to larger and more numerous pores. The dielectric constant of the nanoporous materials in Examples 8A and 8B is much lower than the reference in Comparative Example III.

Bubbles in Example 8B are visible under the optical microscope. These bubbles are about 10-100 μm in diameter. Bubbles in the two other samples were not visible under these conditions.

Transmission electron microscopy of Example 8A showed very small bubbles in the range of from 0.01 μm to 0.15 μm, with a number mean average diameter of 0.059 μm. The reference Comparative Example III shows no bubbles under these conditions.

The diameter of pores in the laminate of Example 8A were as follows:

|  | pores diameter (μm) | | | | | | | |
| --- | --- | --- | --- | --- | --- | --- | --- | --- |
|  | 0.00–0.02 | 0.02–0.04 | 0.04–0.06 | 0.06–0.08 | 0.08–0.10 | 0.10–0.012 | 0.12–0.14 | >0.14 |
| pores concentration (%) | 8.2 | 16.5 | 23.5 | 34.1 | 10.6 | 5.9 | 1.2 | 0 |

Mean average diameters:
$D_n = 0.059$ μm;
$D_a = 0.065$ μm;
$D_v = 0.069$ μm

EXAMPLE 9 AND COMPARATIVE EXAMPLE IV

In these Examples; modified D.E.R. 560, prepared according to Example 2D, was used in a formulation of the present invention and compared to Comparative Example IV without the modified D.E.R. 560, as described in the following Table VI.

The above results show that the use of modified D.E.R. 560, prepared according to Example 2D, did not change the reactivity of the varnish; and Tg, thermal stability and flame retardancy remained similar. The dielectric constant of the nanoporous material in Example 9 is much lower than the reference in Comparative Example IV.

TABLE VI

|  | Comparative Example IV (reference) | Example 9 (nanoporous) |
| --- | --- | --- |
| FORMULATION |  |  |
| D.E.N. 438 [80% N.V. in MEK] (g) | 189.69 | 189.69 |
| modified D.E.R. 560 [70% N.V. in DOWANOL PMA] (g) | 0.00 | 121.11 |
| D.E.R. 560 [70% N.V. in DOWANOL PMA] (g) | 242.23 | 121.11 |
| Perstorp 85.36,28 [50% N.V. in DOWANOL PMA] (g) | 261.70 | 261.70 |
| XZ 92505 [50% N.V. in cyclohexanone] (g) | 90.43 | 90.43 |
| boric acid solution [20% N.V. in MeOH] (g) | 7.91 | 7.91 |
| 2E-4MI [20% N.V. in MeOH] (g) | 5.200 | 5.200 |
| PROPERTIES |  |  |
| stroke cure reactivity @ 170.C. (s) | 234" | 233" |
| film Tg (curing: 10' @ 170° C. + 90' @ 190° C.) (° C.) | 163 | 168 |
| Hand Lay Up Prepreg Properties |  |  |
| time in oven @ 180° C. (s) | 180 | 180 |
| residual gel time (s) | 65 | 65 |
| pressing conditions | 8-ply, 90 minutes @ 190° C., 7 N/cm$^2$ | 8-ply, 90 minutes @ 190° C., 7 N/cm$^2$ |
| LAMINATE PROPERTIES |  |  |
| appearance | yellowish, homogeneous | yellowish, homogeneous |
| Tg (° C.) | 152 | 152 |
| T 288 (min) | 18 | 15 |
| CTE < Tg (ppm/K) | 84 | 68 |
| CTE > Tg (ppm/K) | 255 | 234 |
| Cu peel (N/cm) | not determined | 14.6 |
| Solder float at 288° C. (s) | 265 | 135 |
| Solder dip at 288° C. (s) | 250 | 130 |
| UL 94 rating | V-0 (sum = 24 s) | V-0 (sum = 24 s) |
| Dk @ 1 MHz 25° C. | 5.45 | 4.15 |
| Df @ 1 MHz 25° C. | 0.013 | 0.012 |
| Dk @ 10 MHz 25° C. | 5.34 | 4.06 |
| Df @ 10 MHz 25° C. | 0.013 | 0.012 |
| Dk @ 100 MHz 25° C. | 5.20 | 3.95 |
| Df @ 100 MHz 25° C. | 0.014 | 0.012 |
| Dk @ 500 MHz 25° C. | 5.08 | 3.87 |
| Df @ 500 MHz 25° C. | 0.016 | 0.013 |
| Dk @ 1 GHz 25° C. | 4.95 | 3.82 |
| Df @ 1 GHz 25° C. | 0.017 | 0.013 |

EXAMPLES 10A AND 10B AND COMPARATIVE EXAMPLE V

D.E.R. 560 was modified according to the procedure described in Example 2D and used in the formulations described in Table VII below.

Thin (0.40 mm thick) laminates were pressed with and without applying vacuum. Laminates pressed under vacuum and laminates pressed without vacuum showed similar thickness and resin content.

TABLE VII

|  | Comparative Example V (0% modified D.E.R. 560) | Example 10A (50% modified D.E.R. 560) | Example 10C (100% modified D.E.R. 560) |
|---|---|---|---|
| FORMULATION | | | |
| EPPN502H [80% N.V. in MEK] (g) | 197.418 | 197.418 | 197.418 |
| D.E.N. 438 [80% N.V. in MEK] (g) | 131.615 | 131.615 | 131.615 |
| D.E.R. 560 [70% N.V. in DOWANOL PMA] (g) | 375.587 | 187.793 | 0.000 |
| modified D.E.R. 560 [70% N.V. in DOWANOL PMA] (g) | 0.000 | 187.793 | 375.587 |
| Perstorp 85.36,28 [50% N.V. in MEK] (g) | 450.073 | 450.073 | 450.073 |
| XZ92505 [50% N.V. in cyclohexanone] (g) | 107.311 | 107.311 | 107.311 |
| boric acid solution [20% N.V. in MeOH] (g) | 13.146 | 13.146 | 13.146 |
| 2E-4MI [20% N.V. in MEK] (g) | 11.268 | 11.268 | 11.268 |
| PROPERTIES | | | |
| stroke cure reactivity @ 170° C. (s) | 204 | 213 | 216 |
| Hand Lay-Up Prepreg Properties | | | |
| time in oven @ 180° C. (s) | 260 | 275 | 270 |
| residual gel time (s) | 44 | 49 | 50 |
| Laminate with vacuum ON | | | |
| pressing conditions | 2-ply, 90 minutes @ 190° C., 50 N/cm$^2$ | 2-ply, 90 minutes @ 190° C., 50 N/cm$^2$ | 2-ply, 90 minutes @ 190° C., 50 N/cm$^2$ |
| LAMINATE PROPERTIES | | | |
| appearance | pale yellow, transparent | pale yellow, transparent | pale yellow, translucent |
| laminate resin content (%) | 41 | 40 | 42 |
| Tg (° C.) | 185 | 185 | 185 |
| relative Dk (arbitrary unit) | reference = 1 | 0.98 | 0.92 |
| Laminate with vacuum OFF | | | |
| pressing conditions | 2-ply, 90 minutes @ 190° C., 50 N/cm$^2$ | 2-ply, 90 minutes @ 190° C., 50 N/cm$^2$ | 2-ply, 90 minutes @ 190° C., 50 N/cm$^2$ |
| LAMINATE PROPERTIES | | | |
| appearance | pale yellow, transparent | pale yellow, transparent | pale yellow, translucent |
| laminate resin content (%) | 39 | 39 | 39 |
| Tg (° C.) | 185 | 184 | 185 |
| relative Dk (arbitrary unit) | reference = 1 | 0.85 | 0.80 |

EXAMPLES 11A AND 11B AND COMPARATIVE EXAMPLE VI

D.E.R. 560 was modified according to the procedure described in Example 3 and used in the formulations described in Table VIII below. The results of using varying amounts of the modified D.E.R. 560 are described in the following Table VIII.

TABLE VIII

|  | Comparative Example VI (0% modified D.E.R. 560) | Comparative Example 11A (50% modified D.E.R. 560 High Pressure) | Comparative Example 11B (50% modified D.E.R. 560 Low Pressure) |
|---|---|---|---|
| FORMULATION |  |  |  |
| SMA 3000 [50% N.V. in DOWANOL PMA/MEK] (g) | 2380.8 | 2821.2 |  |
| D.E.R. 560 [70% N.V. in DOWANOL PMA] (g) | 1799.0 |  |  |
| modified D.E.R. 560 [65% N.V. in DOWANOL PMA] (g) |  | 2073.5 | 2073.5 |
| 2E-4MI [20% N.V. in MEK] (g) | 10.7 | 7.00 | 7.00 |
| PROPERTIES |  |  |  |
| stroke cure reactivity @ 170° C. (s) | 210 | 258 | 258 |
| pressing conditions | 8-ply, 90 minutes @ 190° C., no vacuum, 150 N/cm² | 8-ply, 90 minutes @ 190° C., no vacuum, 40 N/cm² | 8-ply, 90 minutes @ 190° C., no vacuum, 25 N/cm² |
| LAMINATE PROPERTIES |  |  |  |
| appearance | whitish | whitish | whitish |
| Tg (° C.) | 178 | 180 | 179 |
| T 300 (min) |  | 28 |  |
| CTE < Tg (ppm/K) |  | 73 |  |
| CTE > Tg (ppm/K) |  | 199 |  |
| Cu peel N/cm) | 9.0 | 9.0 |  |
| UL 94 rating | V-0 | V-0 |  |
| Dk @ 1 MHz 25° C. | 4.29 | 4.10 | 4.01 |
| Df @ 1 MHz 25° C. | 0.009 | 0.008 | 0.007 |
| Dk @ 100 MHz 25° C. | 4.21 | 4.02 | 3.94 |
| Df @ 100 MHz 25° C. | 0.007 | 0.007 | 0.007 |
| Dk @ 500 MHz 25° C. | 4.18 | 3.99 | 3.89 |
| Df @ 500 MHz 25° C. | 0.010 | 0.008 | 0.008 |
| Dk @ 1 GHz 25° C. | 4.16 | 4.03 | 3.88 |
| Df @ 1 GHz 25° C. | 0.012 | 0.007 | 0.007 |

EXAMPLES 12A AND 12B AND COMPARATIVE EXAMPLE VII

In these Examples, varying amounts of modified D.E.R. 539, prepared according to the procedure described in Example 4B, were used. As shown in Table IX below, the use of modified D.E.R. 539 did not change the reactivity of the varnish and Tg remained similar. The increase of modified D.E.R. 539 changed the appearance of the laminate, from clear yellow to white opaque, due to larger pores or due to a higher volume fraction of voids.

TABLE IX

|  | Comparative Example VII (0% modified D.E.R. 539) | Example 12A (50% modified D.E.R. 539) | Example 12B (100% modified D.E.R. 539) |
|---|---|---|---|
| FORMULATION |  |  |  |
| D.E.R. 539-EK80 [80% N.V. in MEK] (g) | 96.98 | 48.49 |  |
| modified D.E.R. 539-EK80 [77% N.V. in MEK] (g) |  | 50.44 | 100.87 |
| DICY solution [10% N.V. in DOWANOL PM/DMF] (g) | 23.28 | 23.27 | 23.27 |
| 2-MI [~20% N.V. in MeOH] (g) | 0.427 | 0.465 | 0.504 |
| DOWANOL PM (g) | 2.39 | 0.41 | 0.00 |
| PROPERTIES |  |  |  |
| stroke cure reactivity @ 170° C. (s) | 229 | 232 | 231 |
| film Tg (curing: 10' @ 170° C. + 90' @ 190° C.) (° C.) | 139 | 137 | 137 |

TABLE IX-continued

|  | Comparative Example VII (0% modified D.E.R. 539) | Example 12A (50% modified D.E.R. 539) | Example 12B (100% modified D.E.R. 539) |
|---|---|---|---|
| Hand Lay-Up Prepreg Properties | | | |
| time in oven @ 180° C. (s) | 250 | 250 | 250 |
| residual gel time (s) | 82 | 84 | 89 |
| prepreg appearance | shiny yellow | pale yellow, slightly foamy | pale yellow, foamy |
| pressing conditions | 2-ply, 90 minutes @ 190° C., 50 N/cm$^2$ | 2-ply, 90 minutes @ 190° C., 50 N/cm$^2$ | 2-ply, 90 minutes @ 190° C., 50 N/cm$^2$ |
| LAMINATE PROPERTIES | | | |
| appearance | yellow, transparent | pale yellow, translucent | very pale yellow, opaque |

EXAMPLE 13

D.E.R. 560 was modified according to the procedure described in Example 3, except with the composition described in the following Table X. The results of measurements carried out on the composition are also described in the following Table X.

TABLE X

|  | Example 13 |
|---|---|
| FORMULATION | |
| anhydride hardener solution (AH1) [50% N.V. in DOWANOL PMA/MEK] | 4137.2 g |
| E.R.L. 4299 | 232.8 g |
| modified D.E.R. 560 described in Example 3 [65% N.V. in DOWANOL PMA] | 2600.0 g |
| boric acid solution [20% N.V. in methanol] | 38.6 g |
| 2E-4MI [20% N.V. in MEK] | 9.0 g |
| PROPERTIES | |
| stroke cure reactivity @ 170° C. | 272 s |
| PREPREG PROPERTIES | |
| prepreg residual gel time | 49 s |
| prepreg minimum melt viscosity @ 140° C. | 170 Pa · s |
| pressing conditions | 30 minutes @ 190° C. + 60 minutes @ 210° C. 8-ply, no vacuum, 3.5 N/cm$^2$ |
| LAMINATE PROPERTIES | |
| appearance | whitish |
| Tg | 183.5° C. |
| T 300 | 20 minutes |
| CTE < Tg | 88 ppm/K |
| CTE > Tg | 240 ppm/K |
| Td onset | 364° C. |
| Cu peel | 7.6 N/cm |
| UL 94 rating | V-0 |
| Dk @ 1 MHz 25° C. | 3.53 |
| Df @ 1 MHz 25° C. | 0.007 |
| Dk @ 100 MHz 25° C. | 3.45 |
| Df @ 100 MHz 25° C. | 0.007 |
| Dk @ 500 MHz 25° C. | 3.41 |
| Df @ 500 MHz 25° C. | 0.007 |

TABLE X-continued

|  | Example 13 |
|---|---|
| Dk @ 1 GHz 25° C. | 3.40 |
| Df @ 1 GHz 25° C. | 0.007 |

EXAMPLE 14

A modified brominated epoxy resin solution was prepared in a 5 L glass reactor, equipped with a mechanical stirrer, and a heating jacket; and fitted with a N$_2$ inlet and an addition funnel. 1225.4 Grams of DOWANOL PMA, 2275.8 g of solid D.E.R. 560 and 310.3 g of E.R.L. 4299 were charged into the reactor, and the solution was heated to 90° C. After complete dilution, the solution was cooled down to 25° C. 136.5 Grams of di-tert-butyl dicarbonate and 0.38 g of dimethyl aminopyridine were added to the solution in 4 portions over a period of 2 hours. Foaming occurred after multiple charges of di-tert-butyl dicarbonate and dimethyl aminopyridine. After all of the di-tert-butyl dicarbonate and dimethyl aminopyridine was added, the solution was stirred for an extra 2 hours at 25° C. No foaming was noticed after this period of time. The solution was transparent. Then, 51.7 g of boric acid solution (20% non-volatile in methanol) was added to the solution. The solution was stirred for an extra hour. The theoretical epoxy equivalent weight for the resultant resin was 401 (based on solids).

EXAMPLES 15A-15D

Modified bisphenol-A phenol novolac solutions were prepared in a glass reactor, equipped with a mechanical stirrer, and a heating jacket; and fitted with a N$_2$ inlet and an addition funnel. The percentage of modification of BPN17 was 5.3%, 10%, 50% and 100% for Example 15A, Example 15B, Example 15C and Example 15D, respectively, as shown in Table XI below. The solutions of BPN17 were charged into the reactor and di-tert-butyl dicarbonate and dimethyl aminopyridine were incorporated into the solutions in portions over a period of 2 h. Foaming occurred after the charges of di-tert-butyl dicarbonate and dimethyl aminopyridine were introduced into the reactor. After all of the di-tert-butyl dicarbonate and dimethyl aminopyridine were incorporated into the reactor, the solution was stirred for an extra 2 hours. No foaming was noticed after this period of time. The solutions were transparent.

TABLE XI

|  | Example 15A | Example 15B | Example 15C | Example 15D |
|---|---|---|---|---|
| FORMULATION |  |  |  |  |
| reaction temperature (° C.) | 35 | 35 | 20-30 | 35 |
| BPN17 [50% solids] (g) | 3293.0 | 592.6 | 459.8 | 320.2 |
| DIBOC [80% solids in toluene] (g) | 198.2 | 67.3 | 261.0 | 363.5 |
| DMAP (g) | 0.44 | 0.15 | 1.17 | 0.81 |
| PROPERTIES |  |  |  |  |
| % modification of the phenolic groups (calculated)(%) | 5.3 | 10 | 50 | 100 |

EXAMPLES 16A-16D AND COMPARATIVE EXAMPLE VIII

In these Examples, various concentrations of thermolabile groups were used to prepare the formulations as described in the following Table XII.

TABLE XII

|  | Example 16A | Example 16B | Example 16C | Example 16D | Comparative Example VIII (reference) |
|---|---|---|---|---|---|
| FORMULATION |  |  |  |  |  |
| E-BPAPN solution [79.6% solids] (g) | 31.66 | 31.66 | 21.10 | 21.10 | 21.10 |
| boric acid solution [20% solids in methanol] (g) | 1.23 | 1.23 | 0.82 | 0.82 | 0.82 |
| modified BPN17 as described in Example 15C [58% solids] (g) | 16.57 | 8.28 | 2.21 | 1.10 | 0 |
| BPN17 solution [50% solids] (g) | 0 | 9.58 | 10.22 | 11.50 | 12.78 |
| TBBA (g) | 9.90 | 9.90 | 6.60 | 6.60 | 6.60 |
| 2-phenyl imidazole solution [20% solids] (g) | 0.38 | 0.38 | 0.25 | 0.25 | 0.25 |
| DOWANOL PM (g) | 9.50 | 8.20 | 4.95 | 4.78 | 4.60 |
| PROPERTIES |  |  |  |  |  |
| stroke cure reactivity @ 170° C. (s) | 125 | 204 | 241 | 247 | 259 |
| film appearance [cure schedule: 10 minutes @ 170° C. + 90 minutes @ 190° C.] | opaque thick foam | opalescent, a lot of bubbles | clear, fine bubbles | clear, almost no bubbles | clear, no bubble |

This Example illustrates that the final morphology of the epoxy matrix varies with the concentration of thermolabile groups.

EXAMPLES 17A-17D AND COMPARATIVE EXAMPLE IX

In these Examples, various concentrations of thermolabile groups were used to prepare the formulations as described in the following Table XIII.

TABLE XIII

|  | Example 17A | Example 17B | Example 17C | Example 17D | Comparative Example IX (reference) |
|---|---|---|---|---|---|
| FORMULATION | | | | | |
| E-BPAPN solution [79.6% solids] (g) | 31.66 | 31.66 | 21.10 | 21.10 | 21.10 |
| boric acid solution [20% solids in methanol] (g) | 1.23 | 1.23 | 0.82 | 0.82 | 0.82 |
| modified BPN17 as described in Example 15C [58% solids] (g) | 16.57 | 8.28 | 2.21 | 1.10 | 0 |
| BPN17 solution [50% solids] (g) | 0 | 9.58 | 10.22 | 11.50 | 12.78 |
| TBBA (g) | 9.90 | 9.90 | 6.60 | 6.60 | 6.60 |
| 2-PhI solution [20% solids] (g) | 0.60 | 0.60 | 0.60 | 0.60 | 0.60 |
| DOWANOL PM (g) | 9.50 | 8.20 | 4.95 | 4.78 | 4.60 |
| PROPERTIES | | | | | |
| film appearance [cure schedule: 30 minutes @ 130° C. + 30 minutes @ 140° C. + 90 minutes @ 190° C.] | opalescent foam | clear, very fine bubbles | clear, no bubble | clear, no bubble | clear, no bubble |

This Example illustrates that the final morphology of the epoxy matrix varies with the concentration of thermolabile groups. A comparison between Example 16 and Example 17 shows that the final morphology of the epoxy matrix varies with the processing conditions, such as the curing temperature.

EXAMPLE 18 AND COMPARATIVE EXAMPLE X

In these Examples, formulations as described in the following Table XIV were compared.

TABLE XIV

|  | Comparative Example X (reference) | Example 18 |
|---|---|---|
| FORMULATION | | |
| E-BPAPN solution [79.6% solids] (g) | 248.0 | 248.0 |
| modified BPN17 as described in Example 15B [58% solids] (g) |  | 129.9 |
| BPN17 solution [50% solids] (g) | 150.4 |  |
| TBBA (g) | 77.4 | 77.4 |
| 2-MI solution [20% solids] (g) | 8.75 | 8.75 |
| acetone (g) | 30.2 | 50.7 |
| PROPERTIES | | |
| stroke cure gel time @ 130° C. (s) | 180 | 175 |
| film appearance [cure schedule: 15 minutes @ 130° C. + 60 minutes @ 190° C.] | clear, almost no bubbles | clear very fine bubbles |
| film Tg (mid point): Tg1 (1$^{st}$ scan)/Tg2 (2$^{nd}$ scan) (° C.) | 195.7/205.5 | 198.7/213.7 |

EXAMPLE 19

A modified brominated epoxy resin solution was prepared in a 5 L glass reactor, equipped with a mechanical stirrer, and a heating jacket; and fitted with a $N_2$ inlet and an addition funnel. 1131.9 Grams of DOWANOL PMA and 2102.1 g of solid D.E.R. 560 were charged into the reactor and the solution was heated to 90° C. After complete dilution, the solution was cooled down to 35° C. 254.6 Grams of di-tert-butyl dicarbonate solution (80% solids in toluene) and 11.4 g of dimethyl aminopyridine solution (5% solids in MEK) were added to the solution drop-wise over a period of 30 minutes. After all of the di-tert-butyl dicarbonate and dimethyl aminopyridine were incorporated into the reactor, the solution was stirred for an extra hour at 35° C. No foaming was noticed after this period of time. The theoretical epoxy equivalent weight of the resultant product was 470 (based on solids).

EXAMPLES 20A-20E AND COMPARATIVE EXAMPLE XI

An epoxy resin solution was prepared by blending 608 g of D.E.R. 330, 392 g of D.E.R. 6615 and 420 g of acetone (herein "Epoxy Blend"). 28.4 Grams of the Epoxy Blend resin solution were weighed in glass bottles. Magnetic stirrers were placed in the bottles and the temperature was controlled at 22° C. Dicarbonate and dimethyl aminopyridine were incorporated into the solution over a period of 30 minutes. The table below describes the compositions used. The solutions were stirred for 24 h at 22° C. After this period of time, solvent was removed in a vacuum oven at 22° C. for 24 h. Clear, very viscous liquids were finally obtained.

The temperature at 1 wt % loss was measured by thermogravimetry analysis (TGA). The results are shown in the following Table XV.

TABLE XV

|  | Comparative Example XI (reference) | Example 20A | Example 20B | Example 20C | Example 20D | Example 20E |
|---|---|---|---|---|---|---|
| FORMULATION |  |  |  |  |  |  |
| Epoxy Blend solution [70.4% solids] (g) | 28.4 | 28.4 | 28.4 | 28.4 | 28.4 | 28.4 |
| DIBOC (g) |  | 2.25 |  |  |  |  |
| di-tert-amyl dicarbonate (g) |  |  | 2.23 |  |  |  |
| diallyl pyrocarbonate (g) |  |  |  | 2.31 |  |  |
| diethyl pyrocarbonate (g) |  |  |  |  | 2.30 |  |
| dimethyl pyroarcbonate (g) |  |  |  |  |  | 2.35 |
| DMAP [5% solids in MEK] (g) |  | 0.76 | 0.66 | 0.91 | 1.04 | 1.28 |
| PROPERTIES |  |  |  |  |  |  |
| % modification of the secondary hydroxyl groups (calculated) (%) | 0 | 50.8 | 44.6 | 61.1 | 69.9 | 86.4 |
| weight % of grafted carbonate (calculated) | 0 | 5 | 5 | 5 | 5 | 5 |
| temperature at 1 weight % loss measured by TGA (° C.) | 204 | 176 | 93 | 110 | 102 | 134 |

Example 20C gelled during heating to 190° C. This could be due to reactive multifunctional molecules coming from the decomposition product released during the cleavage of the thermolabile group.

EXAMPLES 21A AND 21B

In these Examples, the formulations, as described in the table below, were prepared; and the properties of the prepregs and laminates prepared therefrom were measured. The results are shown in the following Table XVI.

TABLE XVI

|  | Example 21A | Example 21B |
|---|---|---|
| FORMULATION |  |  |
| D.E.N. 438 solution [85% solids] (g) | 34.16 | 1373.5 |
| modified epoxy resin solution from Example 19 (g) | 37.91 | 1566.7 |
| BPN17 solution [50% solids] (g) | 48.06 |  |
| XZ-92535 solution [50% solids] (g) |  | 1644.5 |
| boric acid solution [20% solids] (g) | 1.39 | 52.2 |
| 2E-4MI solution [20% solids] (g) | 0.60 | 24.62 |

TABLE XVI-continued

|  | Example 21A | Example 21B |
|---|---|---|
| MEK (g) | 4.87 |  |
| DOWANOL PMA |  | 25.9 |
| PROPERTIES |  |  |
| stroke cure gel time @ 130° C. (s) | 365 | 265 |
| film Tg (mid point): Tg1 (1st scan)/Tg2 (2nd scan) (° C.) | 183.4/184.7 | 187.4/185.3 |
| PREPREG PROPERTIES |  |  |
| prepreg residual gel time @ 170° C. (s) |  | 41 |
| prepreg minimum melt viscosity @ 140° C. (Pa · s) |  | 41 |
| pressing conditions |  | 190° C. for 90 minutes (hot charge @ 180° C.), 2 kgf/cm$^2$ |
| LAMINATE PROPERTIES |  |  |
| appearance |  | opalescent |
| laminate Tg (mid point): Tg1 (1st scan)/Tg2 (2nd scan) (° C.) |  | 185/181 |
| T 288 (min) |  | 21 |
| CTE < Tg (ppm/K) |  | 58 |
| CTE > Tg (ppm.K) |  | 179 |
| high pressure cooker test (120 minutes @ 120° C./20 s |  | 100% pass/water pick-up = 0.34% |
| solder dip @ 260° C.) |  |  |
| UL 94 rating |  | V-0 (sum = 7 s) |
| Dk @ 1 MHz 25° C. |  | 4.52 |
| Df @ 1 MHz 25° C. |  | 0.012 |
| Dk @ 100 MHz 25° C. |  | 4.36 |
| Df @ 100 MHz 25° C. |  | 0.012 |
| Dk @ 1 GHz 25° C. |  | 4.22 |
| Df @ 1 GHz 25° C. |  | 0.012 |

EXAMPLES 22A-22D

In these Examples, the formulations, as described in the table below, were prepared; and the properties of the prepregs and laminates prepared therefrom were measured. The results are shown in the following Table XVII.

TABLE XVII

| FORMULATION |  |
|---|---|
| D.E.R. 560 solution [70% solids] | 1420.7 g |
| D.E.N. 438 solution [85% solids] | 1280.4 g |
| modified BPN17 as described in Example 15A [50% solids] | 1801.4 g |
| boric acid solution [20% solids] | 52.2 g |
| DOWANOL PMA | 102.9 g |
| 2E-4MI [20% N.V. in methanol] | 29.83 g |
| PROPERTIES |  |
| stroke cure reactivity @ 170° C. | 266 s |
| film Tg (mid point): Tg1 (1st scan)/Tg2 (2nd scan) | 184.3/183.5° C. |

|  | Example 22A | Example 22B | Example 22C | Example 22D |
|---|---|---|---|---|
| PREPREG PROPERTIES |  |  |  |  |
| prepreg residual gel time @ 170° C. (s) | 60 | 60 | 60 | 60 |
| prepreg minimum melt viscosity @ 140° C. (Pa · s) | 11.5 | 11.5 | 11.5 | 11.5 |
| pressing conditions | 190° C. for 90 minutes, 0.5 kgf/cm$^2$ | 190° C. for 90 minutes, 1 kgf/cm$^2$ | 190° C. for 90 minutes, 2 kgf/cm$^2$ | 140° C. for 10 minutes @ 0.5 kgf/cm$^2$ + 190° C. for 90 minutes @ 5 kgf/cm$^2$ |

TABLE XVII-continued

| LAMINATE PROPERTIES | | | | |
|---|---|---|---|---|
| appearance | opalescent | opalescent | clear | opaque |
| thickness (cm) | 1.55 | 1.66 | 1.49 | 1.44 |
| laminate Tg (mid point): Tg1 (1st scan)/Tg2 (2nd scan)(° C.) | 184/185 | 181/180 | 184/184 | 188/188 |
| T 300 (min) | 9 | 6.2 | 10 | 7.3 |
| CTE < Tg (ppm/K) | 54 | 55 | 30 | 38 |
| CTE > Tg (ppm/K) | 229 | 226 | 224 | 217 |
| Cu peel (N/cm) | | | | 12.7 |
| UL 94 rating | | | | V-0 |
| high pressure cooker test (60 minutes @ 120° C./20 s solder dip @ 260° C.) | 100% pass/ water pick-up = 0.23% | 100% pass/ water pick-up = 0.25% | 100% pass/ water pick-up = 0.19% | 100% pass/ water pick-up = 0.18% |
| high pressure cooker test (120 minutes @ 120° C./20 s solder dip @ 260° C.) | 50% pass/ water pick-up = 0.56% | 100% pass/ water pick-up = 0.57% | 100% pass/ water pick-up = 0.50% | |
| Dk @ 1 MHz 25° C. | 4.37 | | 4.71 | 4.64 |
| Df @ 1 MHz 25° C. | 0.013 | | 0.013 | 0.012 |
| Dk @ 100 MHz 25° C. | 4.19 | | 4.62 | 4.43 |
| Df @ 100 MHz 25° C. | 0.014 | | 0.014 | 0.014 |
| Dk @ 1 GHz 25° C. | 4.16 | | 4.55 | 4.34 |
| Df @ 1 GHz 25° C. | 0.015 | | 0.015 | 0.013 |

EXAMPLE 23

A modified 2-ethyl-4-methyl imidazole solution was prepared in a glass bottle, equipped with a magnetic stirrer. 11.0 Grams of 2-ethyl-4-methyl imidazole solution (20% solids in DOWANOL PMA) was weighed in the glass bottle; and 5.45 g of di-tert-butyl dicarbonate solution (80% solids in toluene) was incorporated into the solution drop-wise over a period of 5 minutes, at 20° C. Foaming happened during the incorporation of di-tert-butyl dicarbonate. After all of the di-tert-butyl dicarbonate had been incorporated into the bottle, the solution was stirred for 48 h at 20° C. No foaming was noticed after this period of time. The solution was transparent.

EXAMPLES 24A-24F AND COMPARATIVE EXAMPLES XII-XIV

In these Examples, the formulations, as described in the table below, were prepared; and the properties measured are shown in Tables XVIR and XIX below.

TABLE XVIII

| | Comparative Example XII | Example 24A | Example 24B | Example 24C | Example 24D |
|---|---|---|---|---|---|
| FORMULATION | | | | | |
| D.E.R. 592-A80 solution [80% solids] (g) | 60.44 | 60.00 | 60.00 | 60.00 | 60.00 |
| DICY solution [10% solids] (g) | 15.47 | 15.36 | 15.36 | 15.36 | 15.36 |
| 2E-4MI solution [20% solids] (g) | 0.484 | | | | |
| modified 2E-4MI solution from Example 23 [28% solids] (g) | | 0.34 | 0.65 | 1.31 | 1.63 |
| DOWANOL PMA (g) | 0.69 | 0.76 | 0.76 | 0.76 | 0.76 |
| catalyst concentration (%, based on solids) | 0.19 | 0.19 | 0.37 | 0.74 | 0.92 |
| 2E-4MI concentration (%, based on solids) | 0.19 | 0.10 | 0.19 | 0.39 | 0.48 |
| PROPERTIES | | | | | |
| stroke cure gel time @ 170° C. (s) | 309 | 675 | 565 | 371 | 322 |

TABLE XIX

|  | Comparative Example XIII | Example 24E | Comparative Example XIV | Example 24F |
|---|---|---|---|---|
| FORMULATION |  |  |  |  |
| D.E.R. 592-A80 solution [80% solids] (g) | 30.16 | 29.73 | 36.30 | 36.27 |
| DICY solution [10% solids] (g) | 7.72 | 7.61 | 9.29 | 9.29 |
| 2E-4MMI solution [20% solids] (g) | 0.483 |  | 0.15 |  |
| modified 2E-4MI solution from Example 23 [28% solids] (g) |  | 1.619 |  | 0.19 |
| DOWANOL PMA (g) | 0.70 | 0.10 | 1.14 | 1.18 |
| catalyst concentration (%, based on solids) (%) | 0.39 | 1.83 | 0.10 | 0.18 |
| 2E-4MI concentration (%, based on solids) (%) | 0.39 | 0.96 | 0.10 | 0.10 |
| PROPERTIES |  |  |  |  |
| stroke cure gel time @ 140° C. (s) | 372 | >900 |  |  |
| stroke cure gel time @ 200° C. (s) |  |  | 148 | 160 |

This Example shows that modified 2-ethyl-4-methyl imidazole solution from Example 23 acts as a latent/blocked catalyst. At temperature lower than the unblocking temperature, the modified 2-ethyl-4-methyl imidazole solution from Example 23, shows no catalytic activity or a much lower catalytic activity than 2-ethyl-4-methyl imidazole. When the temperature reaches the unblocking temperature, the catalytic activity of the modified 2-ethyl-4-methyl imidazole solution from Example 23 increases. Furthermore, the modified 2-ethyl-4-methyl imidazole solution from Example 23 shows almost the same catalytic efficiency than 2-ethyl-4-methyl imidazole at a temperature higher than the unblocking temperature.

EXAMPLE 25

A modified phenol novolac solution was prepared in a glass bottle, equipped with a magnetic stirrer. 21.51 Grams of XZ-92535 phenol novolac resin solution (50% solids in DOWANOL PMA) were weighed in the glass bottle. The phenol novolac resin was modified with a stochiometric amount of di-tert-butyl dicarbonate in order to cap all phenol groups. 28.15 Grams of di-tert-butyl dicarbonate solution (80% solids in toluene) and 0.38 g of dimethyl aminopyridine (solid) were incorporated into the solution in 5 portions over a period of 1 h, at 20° C. while stirring. Foaming happened during the incorporation of di-tert-butyl dicarbonate. After all di-tert-butyl dicarbonate has been incorporated into the bottle, the solution was stirred for 18 h at 20° C. No foaming was noticed after this period of time. The solution was transparent, with a low viscosity.

The Cannon-Fenske viscosity of XZ-92535 was 1166.1 cSt; and the Cannon-Fenske viscosity of the modified XZ-92535 was 29.1 cSt.

This Example shows that capping the phenol groups of the phenol novolac resin with tert-butyl carbonate group drastically reduces the solution viscosity, probably because of less hydrogen bonding effect.

EXAMPLE 26

A modified brominated epoxy resin solution was prepared in a glass bottle, equipped with a magnetic stirrer. 139.3 Grams of D.E.R. 560 brominated epoxy resin solution (70% solids in DOWANOL PMA) was weighed in the glass bottle. 10.6 Grams of di-tert-butyl dicarbonate solution (80% solids in toluene) and 0.143 g of dimethyl aminopyridine (solid) were incorporated into the solution in portions over a period of 15 minutes, at 25° C. under stirring. Foaming happened during the incorporation of di-tert-butyl dicarbonate. After all of the di-tert-butyl dicarbonate was incorporated into the solution, the solution was stirred for 48 h at 25° C. No foaming was noticed after this period of time. The solution was transparent, with a low viscosity.

The Cannon-Fenske viscosity of D.E.R. 560 brominated epoxy resin solution was 262.3 cSt; and the Cannon-Fenske viscosity of the modified D.E.R. 560 brominated epoxy resin solution was 198.0 cSt.

This Example shows that capping the secondary hydroxyl groups of the brominated epoxy resin solution with tert-butyl carbonate groups reduces the solution viscosity, probably because of less hydrogen bonding effect.

EXAMPLE 27

To perform the modification in this Example, a 12 L round bottomed flask with a 5-neck fitted lid and equipped with a condenser, mechanical stirrer, $N_2$ inlet, addition funnel and thermocouple was used. An 80% solids solution of D.E.R. 592 (10 kg, dark brown solution) was charged into the flask followed by the addition of acetone (589 g) to reduce the solution viscosity. Di-tert-butyl dicarbonate (168.7 g, colorless liquid) was then added to the reactor and the solution was heated to 40° C. Dimethyl aminopyridine (0.48 g, white crystalline solid) was dissolved in acetone and added drop-wise to the solution. The addition proceeded over a 30-minute time period to reduce the amount of foaming in the reactor. After the addition was complete, the solution was stirred for an additional 3 hours. At the beginning of this time period, the solution was dark brown in color and filled with bubbles. At completion, no bubbles remained.

EXAMPLES 28A-28D

In these Examples, the formulations, as described in the table below, were prepared; and the properties measured are shown in Tables XX and XXI below.

TABLE XX

| FORMULATION | |
|---|---|
| modified D.E.R. 592 solution as described in Example 27 [76% solids] | 7055 g |
| XZ 92505 solution [50% solids] | 643 g |
| boric acid solution [20% solids] | 161.7 g |
| acetone | 80 g |
| 2E-4MI [10% solids] | 1341.6 g |
| PROPERTIES | |
| stroke cure reactivity @ 150° C. | 265 s |
| prepreg residual gel time @ 170° C. | 81 s |

TABLE XXI

| | Example 28A | Example 28B | Example 28C | Example 28D |
|---|---|---|---|---|
| pressing conditions | 190° C. for 90 minutes, 100 psi | 150° C. for 15 minutes + 190° C. for 90 minutes, 60 psi | 150° C. for 15 minutes + 190° C. for 90 minutes, 45 psi | 150° C. for 15 minutes + 190° C. for 90 minutes, 30 psi |
| LAMINATE PROPERTIES | | | | |
| appearance | brown and clear | brown and cloudy | brown and cloudy | brown and cloudy |
| laminate Tg (mid point): Tg1 (1$^{st}$ scan)/Tg2 (2$^{nd}$ scan) (° C.) | | 167/172 | 174/180 | 174/179 |
| T 260 (min) | | 7 | 7 | 7 |
| Td, 5% wt loss (° C.) | | 302 | 302 | 301 |
| CTE < Tg (ppm/° C.) | | 26 | 42 | 65 |
| CTE > Tg (ppm/° C.) | | 307 | 328 | 332 |
| Cu peel (lb/in.) | 4.4 | 4 | 3.91 | 3.85 |
| UL 94 rating | | V-0 | V-0 | V-0 |
| Dk @ 1 MHz 25° C. | 4.56 | 4.14 | 4.05 | 4.03 |
| Df @ 1 MHz 25° C. | 0.01 | 0.01 | 0.01 | 0.01 |
| Dk @ 100 MHz 25° C. | 4.38 | 3.97 | 3.88 | 3.86 |
| Df @ 100 MHz 25° C. | 0.01 | 0.01 | 0.01 | 0.01 |
| Dk @ 1 GHz 25° C. | 4.47 | 3.86 | 3.74 | 3.75 |
| Df @ 1 GHz 25° C. | 0.02 | 0.01 | 0.01 | 0.01 |

EXAMPLES 29A-29E

In these Examples, the formulations, as described in the table below, were prepared; and the properties measured are shown in Table XXII below.

TABLE XXII

| FORMULATION | |
|---|---|
| modified D.E.R. 592 solution as described in Example 27 [76% solids] | 7455 g |
| DICY [10% solids] | 1643.5 g |
| 2-MI [10% solids] | 198.9 g |

TABLE XXII-continued

PROPERTIES

| | |
|---|---|
| stroke cure reactivity @ 150° C. | 297 s |
| prepreg residual gel time @ 170° C. | 81 s |

| | Example 29A | Example 29B | Example 29C | Example 29D | Example 29E |
|---|---|---|---|---|---|
| pressing conditions | 175° C. for 60 minutes, 100 psi | 175° C. for 60 minutes, 60 psi | 130° C. for 15 minutes + 175° C. for 60 minutes, 60 psi | 175° C. for 60 minutes, 45 psi | 130° C. for 15 minutes + 175° C. for 60 minutes, 30 psi |
| LAMINATE PROPERTIES | | | | | |
| appearance | yellow and clear | yellow and clear | yellow and clear | yellow and clear | yellow and clear |
| laminate Tg (mid point): Tg1 (1st scan)/Tg2 (2nd scan) (° C.) | | 154/155 | 156/155 | 152/155 | 159/159 |
| T 260 (minutes) | | 7 | 7 | 4 | 6 |
| Td, 5% wt loss (° C.) | | 301 | 302 | 302 | 301 |
| CTE < Tg (ppm/° C.) | | | 114 | 65 | 84 |
| CTE > Tg (ppm/° C.) | | 208 | 242 | 233 | 375 |
| Cu peel (lb/inch) | 6.3 | 5.92 | | 5.97 | 6.36 |
| UL 94 rating | | V-0 | V-0 | V-0 | V-0 |
| Dk @ 1 MHz 25° C. | 4.5 | 4.34 | 4.49 | 4.28 | 4.1 |
| Df @ 1 MHz 25° C. | 0.01 | 0.01 | 0.01 | 0.01 | |
| Dk @ 100 MHz 25° C. | 4.36 | 4.14 | 4.29 | 4.08 | 3.96 |
| Df @ 100 MHz 25° C. | 0.01 | 0.01 | 0.01 | 0.01 | |
| Dk @ 1 GHz 25° C. | 4.36 | 4.09 | 4.12 | 3.92 | 3.79 |
| Df @ 1 GHz 25° C. | 0.01 | 0.01 | 0.01 | 0.01 | |

EXAMPLE 30

A modified high molecular weight epoxy resin solution was prepared in a 1 L glass reactor, equipped with a mechanical stirrer, and a heating jacket; and fitted with a $N_2$ inlet and an addition funnel. 316.6 Grams of D.E.R. 669E solution [40% NV in DOWANOL PMA] were charged into the reactor and the temperature was controlled between 25° C. and 30° C. 118.8 Grams of di-tert-butyl dicarbonate solution [80% NV in toluene] and 5.32 g of dimethyl aminopyridine solution [10% N.V. in MEK] were added drop-wise to the solution over a period of 2 hours. Foaming occurred during the incorporation of di-tert-butyl dicarbonate and dimethyl aminopyridine. After all of the di-tert-butyl dicarbonate and dimethyl aminopyridine were incorporated into the solution, the solution was stirred for an extra 2 hours at 25° C. The solution was transparent. The theoretical epoxy equivalent weight was 4179 (based on solids).

The modified D.E.R. 669E solution was then used as an epoxy-functional foaming agent additive in electrical laminates formulations.

The Cannon-Fenske viscosity at 25° C. of D.E.R. 669E solution [40% N.V.] was 1542 cSt; and the Cannon-Fenske viscosity at 25° C. of the modified D.E.R. 669E solution [40.4% N.V.] was 743 cSt.

EXAMPLE 31

In this Example, the formulation, as described in the table below, was prepared and the properties measured are shown in Table XXIII below.

TABLE XXIII

| FORMULATION | |
|---|---|
| XZ-92567.01 [65% NV] | 1994.2 g |
| XZ-92568.01 [50% NV] | 2351.4 g |
| modified epoxy resin described in Example 30 [40% NV] | 254.1 g |
| DOWANOL PMA | 122.4 g |
| 2E-4MI [20% N.V. in DOWANOL PMA] | 5.20 g |
| PREPREG PROPERTIES | |
| prepreg residual gel time @ 170° C. | 72 s |
| prepreg minimum melt viscosity @ 140° C. | 410 Pa·s |
| pressing conditions | 190° C. for 90 minutes, 10 kgf/cm² |
| LAMINATE PROPERTIES | |
| appearance | opaque, homogeneous |
| laminate Tg measured by DMTA @ 10 Hz | 194° C. |
| high pressure cooker test (120 minutes @ 120° C./20 s solder dip @ 260° C.) | 100% pass/water pick-up = 0.30% |

What is claimed is:
1. An organic resin matrix composition comprising:
  (a) a curable reaction product of: (a1) an organic resin featuring hydrogen active groups and (a2) a compound containing a thermolabile carbonate group, wherein the thermolabile carbonate group is grafted onto the backbone of the organic resin by reaction of said compound with said hydrogen active groups;
  (b) a curing agent;
  (c) an optional solvent; and
  (d) an optional catalyst;

wherein heating of the organic resin matrix composition to a temperature of about 120° C. to about 220° C. results in thermal degradation and volatilization of the thermolabile group such that nano size voids are produced in the resulting cured organic resin matrix.

2. The composition of claim 1 wherein the organic resin is selected from the group consisting of epoxy resins, phenolic resins, polimide resins, polyamide resins, polyester resins, polyether resins, bismaleimide triazine resins, cyanate ester resins, vinyl ester resins, hydrocarbon resins, and mixture of thereof.

3. The composition of claim 1 wherein the organic resin is selected from the group consisting of a brominated epoxy resin, a phosphorus-containing epoxy resin, an epoxy resin with an epoxy equivalent weight higher than 500, and mixture thereof.

4. The composition of claim 1 wherein the thermolabile group is tert-butyl carbonate.

5. The composition of claim 1 wherein the thermolabile group is present in an amount such that the weight percent of thermolabile groups in the resin composition is from about 0.01 weight percent to about 10 weight percent, based on solids.

6. The composition of claim 1 wherein the solvent is a ketone, an acetate of glycol ethers or mixtures thereof.

7. The composition of claim 1 wherein the solvent is present in an amount of from about 10 parts by weight to about 60 parts by weight, based on 100 parts by weight of the composition.

8. A light weight cured product of the composition of claim 1 featuring nano size voids.

9. A varnish comprising the composition of claim 1 and optional desired additives.

10. A fiber reinforced composite article comprising a fiber reinforcement impregnated or coated with the varnish of claim 9.

11. The fiber reinforced composite article of claim 10 wherein said varnish is dried, cured, or partially cured to from a laminate, a prepreg, or an insulating coating for an electric circuit.

12. A prepreg comprising a woven fabric impregnated with the varnish of claim 9, wherein said varnish is at least partially cured.

13. A laminate comprising: the prepreg of claim 12 and a layer of metal disposed on at least one surface of said prepreg, wherein said varnish is fully cured.

14. The laminate of claim 13 wherein the woven fabric is a woven glass fabric.

15. A printed wiring board comprising the laminate of claim 14.

16. A process of producing a coated article comprising: coating said article with the varnish of claim 9; and heating the coated article to cure said varnish.

17. The process of claim 16 wherein the article is a metal foil.

18. The process of claim 17 wherein the metal foil is a copper foil or an aluminum foil.

* * * * *